US010511050B1

(12) United States Patent
Rahimian et al.

(10) Patent No.: US 10,511,050 B1
(45) Date of Patent: Dec. 17, 2019

(54) BATTERY STATE OF HEALTH ESTIMATION BY TRACKING ELECTRODE AND CYCLABLE LITHIUM CAPACITIES

(71) Applicant: SF Motors, Inc., Santa Clara, CA (US)

(72) Inventors: Saeed Khaleghi Rahimian, San Jose, CA (US); Sangwoo Han, Mountain View, CA (US); Junzhe Shi, Santa Clara, CA (US); Wenke Zhang, Santa Clara, CA (US); Ying Liu, Santa Clara, CA (US); Jun Hou, San Mateo, CA (US); Chen-Yen Yu, San Jose, CA (US); Yifan Tang, Santa Clara, CA (US)

(73) Assignee: SF Motors, Inc., Santa Clara, CA (US)

( * ) Notice: Subject to any disclaimer, the term of this patent is extended or adjusted under 35 U.S.C. 154(b) by 0 days.

(21) Appl. No.: 16/237,534

(22) Filed: Dec. 31, 2018

(51) Int. Cl.
*G01N 27/42* (2006.01)
*H01M 10/0525* (2010.01)
*H01M 10/42* (2006.01)
*G01R 31/382* (2019.01)
*H01M 10/48* (2006.01)
(Continued)

(52) U.S. Cl.
CPC ...... *H01M 10/0525* (2013.01); *G01R 31/367* (2019.01); *G01R 31/3648* (2013.01); *G01R 31/382* (2019.01); *H01M 8/04552* (2013.01); *H01M 10/425* (2013.01); *H01M 10/4207* (2013.01); *H01M 10/48* (2013.01); *H01L 2924/00* (2013.01); *H01L 2924/0002* (2013.01);
(Continued)

(58) Field of Classification Search
CPC ......... H01M 10/48; H01M 2008/1095; H01M 8/04552; H01M 10/4207; H01L 2924/0002; H01L 2924/00; G01R 31/3648; G01R 31/367
USPC ............................ 324/76.11-76.83, 425-428
See application file for complete search history.

(56) References Cited

U.S. PATENT DOCUMENTS

| 2012/0105068 A1* | 5/2012 | Wang ................ H01M 10/0525 324/427 |
| 2012/0105069 A1* | 5/2012 | Wang ................... G01R 31/392 324/427 |

(Continued)

OTHER PUBLICATIONS

Dubarry et al.; "Identify capacity fading mechanism in a commercial LiFePO4 cell"; Journal of Power Sources 194 (2009); 541-549.
(Continued)

*Primary Examiner* — Raul J Rios Russo
(74) *Attorney, Agent, or Firm* — Bachmann Law Group PC

(57) ABSTRACT

Battery health is determined by estimating a battery anode capacity, battery cathode capacity, and cyclable lithium capacity. Determining electrode and lithium capacity may include determining anode and cathode open cell voltages (OCV) at the beginning of battery life, and estimating the full cell OCV from the individual (half-cell) OCV values. Once the beginning of battery life information is known, the state of charge (SOC) for a battery is measured during battery life. The SOC measurements may be captured at a plurality of different levels. The cathode capacity, anode capacity, and cycle mobile lithium capacity are then determined from the beginning of life OCV data and plurality of SOC data. The capacities can be used to detect degradation, and a battery management system can take steps to reduce further degradation based on the capacity values.

20 Claims, 6 Drawing Sheets

(51) Int. Cl.
*H01M 8/04537* (2016.01)
*G01R 31/36* (2019.01)
*G01R 31/367* (2019.01)
*H01M 8/1018* (2016.01)

(52) U.S. Cl.
CPC .............. *H01M 2008/1095* (2013.01); *H01M 2010/4271* (2013.01)

(56) References Cited

U.S. PATENT DOCUMENTS

| | | | |
|---|---|---|---|
| 2013/0317771 A1* | 11/2013 | Laskowsky | B60L 58/16 |
| | | | 702/63 |
| 2017/0033572 A1* | 2/2017 | Becker | H01M 10/48 |
| 2017/0052228 A1* | 2/2017 | Hariharan | H01M 10/484 |
| 2017/0146608 A1* | 5/2017 | Lee | G01R 31/367 |

OTHER PUBLICATIONS

He et al.;"Online model-based estimation of state-of-charge and open-circuit voltage of lithium-ion batteries in electric vehicles"; J. Energy 39 (2012); 310-318.
Levenberg, K; "A Method for the Solution of Certain Problems in Least-Squares"; J. Quarterly Applied Mathematics 2 (1944); 164-168.
Marquardt, D.; "An Algorithm for Least-Squares Estimation of Nonlinear Parameters"; Journal of the Society for Industrial and Applied Mathematics, vol. 11 No. 2 (1963); 431-441.
Vetter et al.; "Ageing mechanisms in lithium-ion batteries"; Journal of Power Sources, 147 (2005); 269-281.

\* cited by examiner

BATTERY STATE OF HEALTH ESTIMATION BY TRACKING ELECTRODE AND CYCLABLE LITHIUM CAPACITIES

BACKGROUND

The performance of Li-ion batteries degrades during cycling and under storage conditions due to cell capacity loss and resistance rise. Several cell aging mechanisms have been identified to be responsible for this performance decay. Solid Electrolyte Interphase (SEI) formation on anode particles, SEI film growth, metallic Li plating side reaction in anode, particle cracking, contact loss of active material particles, and electrode porosity reduction are the main degradation mechanisms in typical Li-ion cells. Capacity fade mechanisms can be categorized into three main groups: loss of cyclable Lithium ion, loss of anode active material, and loss of cathode active material. For instance, SEI formation and Li plating contribute primarily to loss of cyclable Lithium while the particle cracking is mostly responsible for loss of electrodes' active materials. Existing state of health estimation methods do not predict the state of each electrode and the amount of available lithium in a battery cell, and as a result to not provide adequate information to identify degradation issues in a battery cell.

SUMMARY

The present technology, roughly described, determines the health of the battery by estimating a battery anode capacity, battery cathode capacity, and cyclable lithium capacity. By determining these capacities, a battery management system can identify causes of degradation in the battery and take actions to reduce the degradation. Determining electrode and lithium capacity may include determining anode and cathode open cell voltages (OCV) at the beginning of battery life, and estimating the full cell OCV from the individual (half-cell) OCV values. Once the beginning of battery life information is known, the cell OCV is measured at different states of charge (SOCs) during battery life. The different SOC measurements may spread, in some instances, equally or approximately equally throughout the battery charge range. The cathode capacity, anode capacity, and cyclable lithium capacity are then determined from the beginning of life half-cell OCVs and cell OCV data during cell life. The capacities can be used to detect degradation, and a battery management system can take steps to reduce further degradation based on the capacity values, for example by adjusting fast charging processes.

In embodiments, a method is disclosed for determining the health of a battery. An anode open circuit voltage (OCV) can be determined from a battery anode and a cathode OCV from a battery cathode. An OCV is estimated for a full battery from the anode OCV and the cathode OCV. A battery management system on a battery powered system measures a plurality of full cell OCVs during the lifecycle of a first battery, wherein each of the plurality of full cell OCVs are measured at a different state of charge for the first battery. A battery management system on a battery powered system determines an anode capacity, a cathode capacity, and a lithium ion capacity in the first battery based on the measured SOCs, the anode OCV, and the cathode OCV. The battery management system analyzes the anode capacity, a cathode capacity, and a lithium ion capacity to predict a degradation source in the first battery.

In embodiments, a non-transitory computer readable storage medium includes a program, the program being executable by a processor to perform a method for determining the health of a battery. The method includes determining an anode open circuit voltage (OCV) can from a battery anode and a cathode OCV from a battery cathode. An OCV is determined for a full battery from the anode OCV and the cathode OCV. A battery management system on a battery powered system measures a plurality of full cell OCVs during the lifecycle of a first battery, wherein each of the plurality of full cell OCVs are measured at a different state of charge for the first battery. A battery management system on a battery powered system determines an anode capacity, a cathode capacity, and a lithium ion capacity in the first battery based on the measured cell OCV during battery life, and the anode OCV, and the cathode OCV at beginning of life (BOL). The battery management system analyzes the anode capacity, a cathode capacity, and a lithium ion capacity to predict a degradation source in the first battery.

In embodiments, a system for automatically applying a charging profile to a battery cell includes one or more processors, memory, and one or more modules stored in memory and executable by the one or more processors. When executed, the one or more modules determine an anode open circuit voltage (OCV) from a battery anode and a cathode OCV from a battery cathode, estimate the OCV for a full battery from the anode OCV and the cathode OCV, measure a plurality of full cell OCVs during the lifecycle of a first battery, wherein each of the plurality of full cell OCVs are measured at a different state of charge for the first battery, determine an anode capacity, a cathode capacity, and a lithium ion capacity in the first battery based on the measured SOCs, the anode OCV, and the cathode OCV, and analyze the anode capacity, a cathode capacity, and a lithium ion capacity to predict a degradation source in the first battery.

DETAILED DESCRIPTION

The present technology, roughly described, determines the health of the battery by estimating a battery anode capacity, battery cathode capacity, and cyclable lithium capacity. By determining these capacities, a battery management system can identify causes of degradation in the battery and take actions to reduce the degradation. Determining electrode and lithium capacity may include determining anode and cathode open cell voltages (OCV) at the beginning of battery life, and estimating the full cell OCV from the individual (half-cell) OCV values. Once the beginning of battery life information is known, the cell OCV is measured at different states of charge (SOCs) during battery life. The different SOC measurements may spread, in some instances, equally or approximately equally throughout the battery charge range. (e.g., 100%, 90%, 80%, 70%, 60%, and so forth). The cathode capacity, anode capacity, and cyclable lithium capacity are then determined from the beginning of life half-cell OCVs and cell OCV data during cell life. The capacities can be used to detect degradation, and a battery management system can take steps to reduce further degradation based on the capacity values, for example by adjusting fast charging processes.

The technical problem addressed by the present technology relates to identifying degradation in batteries. To determine the health of a battery, it is important to gather as much information as possible regarding the capacity of the battery. Existing processes are not able to determine the health or capacity of a particular electrode within a battery cell. A viable method for detecting the capacity of cyclable lithium is also not available. In order to determine the occurrence of degradation and the source of the degradation of the battery, more details and accuracy is needed for assessing the health of a lithium battery.

The present technology provides a technical solution to the technical problem of accurately obtaining details of battery capacity in order to identify sources of batteries degradation and loss of performance. The present technology determines the health of the battery by estimating a battery anode capacity, battery cathode capacity, and cyclable lithium capacity. The capacities are determined at least in part from half-cell cathode and anode OCV values determined at beginning of life for a battery, a full cell OCV determined from the half-cell values, and battery SOC values measured during the battery lifecycle. By determining these capacities, a battery management system has insight into more detailed aspects of the battery being managed, and can identify causes of degradation in the battery more accurately than with previous methods. The BMS can then take actions to reduce the degradation occurring in the managed battery.

Figure 1:
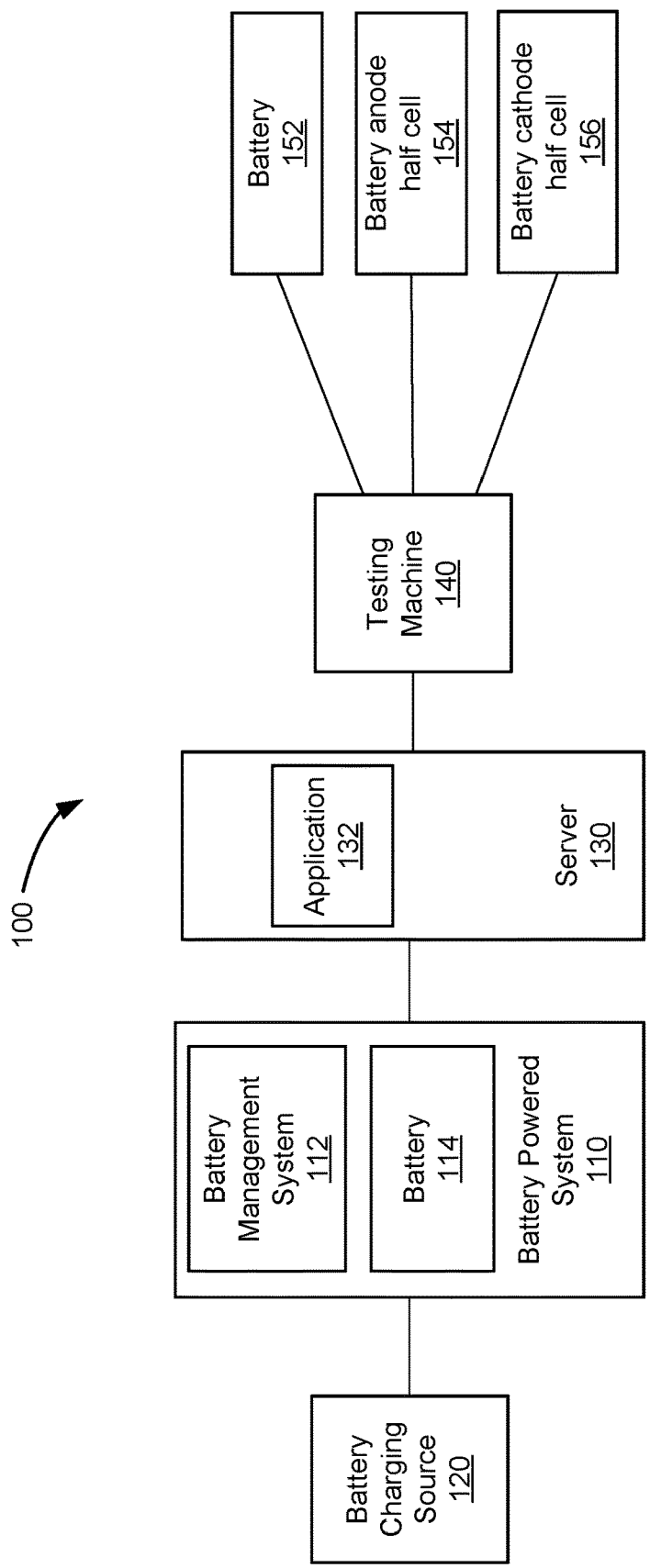
FIG. 1 is a block diagram of a battery monitoring system.

FIG. 1 is a block diagram of a battery monitoring system 100. Battery charging system 100 includes battery-powered system 110, battery charging source 120, server 130, testing machine 140, battery 152, battery anode half-cell 154, and battery cathode half-cell 156. Eah of the elements 110-156 may be coupled with and communicate over one or more networks, including but not limited to public networks, private networks, cellular networks, wireless networks, the Internet, an intranet, a WAN, a LAN, a BLUETOOTH or other radio frequency signal, a plain-old-telephone-service (POTS), and/or any other network suitable for communicating digital and/or analog data over.

The elements illustrated in FIG. 1 are depicted in a manner and organization intended to be exemplary, and are not intended to be limiting. For example, each of battery source 120, server 130, and testing machine 140 may be implemented as one or more machines, servers, logical machines or servers, and may be separately implemented from or completely and/or partially combined with each other.

The data processing discussed herein is also discussed in a manner and organization intended to be exemplary, and it not intended to be limiting. For example, although an exemplary process is described in which data is retrieved from batteries by testing machine 140, provided to and processed by application 132, and then the processed data is provided to battery management system 112, the data may be retrieved by, processed in whole or in part, and transmitted in raw or processed form between different machines, servers and systems of FIG. 1, as well as by additional machines and servers not illustrated in FIG. 1.

Testing machine 140 may be used to charge, test, measure, and acquire information from battery cell 152, anode half-cell 154, and cathode half-cell 156. Though only three battery cells and half-cells are shown in communication with testing machine 140, any number of batteries may be connected to testing machine 140 at any time.

Testing machine 140 may also obtain information from the batteries, either before, during, or after charging, as well as monitor their performance during a charging and discharge process. In some instances, testing machine 140 can determine an open circuit voltage (OCV) for an anode half-cell and a cathode half-cell. The half-cell OCV can be measured, at beginning of life for the battery, at multiple SOCs, such as for example at least 11 SOCs. In some instances, to test a half-cell, a full cell battery can be opened so that the anode and cathode half-cells can each be accessed. In some instances, an anode and cathode half-cell can each be separately tested in a working environment before they are placed inside a full cell can. Testing machine 140 can, while monitoring OCV, charge a full cell or half-cell anode or cathode as well as discharge an anode or cathode half-cell.

Server 130 may be implemented by one or more machines, logical machines, or other combinations of hardware and software, and may operate to receive (may receive pushed data or retrieve data in response to a request) the data obtained by testing machine 140. In some instances, application 132 on server 130 may receive half-cell OCV information, at multiple SOCs (e.g., 100%, 90%, 80%, 70%, 60%, and so forth through 0%), from testing machine 140 and use the information to estimate electrode stoichiometry limits in a full battery cell. Application 132 may apply a damped least squares method (i.e., Levenberg Marquardt algorithm) to fit a full cell OCV using the half-cell anode and cathode OCVs data obtained by testing machine 140. Application 132 may communicate with battery management system (BMS) 112, for example to provide BMS 112 with the half-cell and full cell OCV information. Application 132 may also communicate with other devices, including but not limited to data stores, battery charging source 120, and other servers and applications (not illustrated in FIG. 1).

Battery-powered system 110 may include a system or product that utilizes a battery. Examples of a battery-powered system 110 include an electronic vehicle, mobile phone, computer, or some other device that utilizes a battery. BMS 112 may be implemented as hardware and/or software that controls, measures, and provides charging to a battery 114 on system 110. BMS may also monitor and measure performance and other aspects of battery 114, such as for example a state of charge (SOC) and an OCV of full cell battery 114. BMS 112 may apply a charging process to the battery 114 through charge provided by charging source 120.

In some instances, BMS may measure the full cell OCV of battery 114 at a plurality of SOC values. BMS may also process measured data, such as for example by estimating cathode capacity, anode capacity, cyclable lithium ion capacity from half-cell and full cell OCV. BMS 112 may further predict degradation from estimated electrode and lithium capacity estimations and may apply modified charging protocols based on degradation of certain elements of battery 114. More detail for BMS 112 is discussed with respect to FIG. 2.

Battery 114 may include a lithium-ion battery with an anode and cathode. The lithium battery 114 may be the same battery as battery 152 or may be similar to lithium battery 152, and may have an anode and cathode that are similar to the anode half-cell 154 and the cathode half-cell 156 of FIG. 1. If the battery and/or half-cells are similar, for example, they may be one or more of the same manufacturer, type, model, and batch. Though the present technology is discussed with respect to a lithium-ion battery, the specific battery type is meant for purposes of example only, and is not intended to be limiting.

Battery charging source 120 may include any suitable source of charge for charging a battery 114. In some instances, in the case of a system 110 implemented as an electronic vehicle, battery charging source 120 may be a dealership, charging pump, or a power outlet commonly found in a home, business or other building. When system 110 is implemented as a phone or computer, a suitable battery charging source 120 may include a mobile charging pack, car charger, or power outlet found in a home, business or other building.

Figure 2:
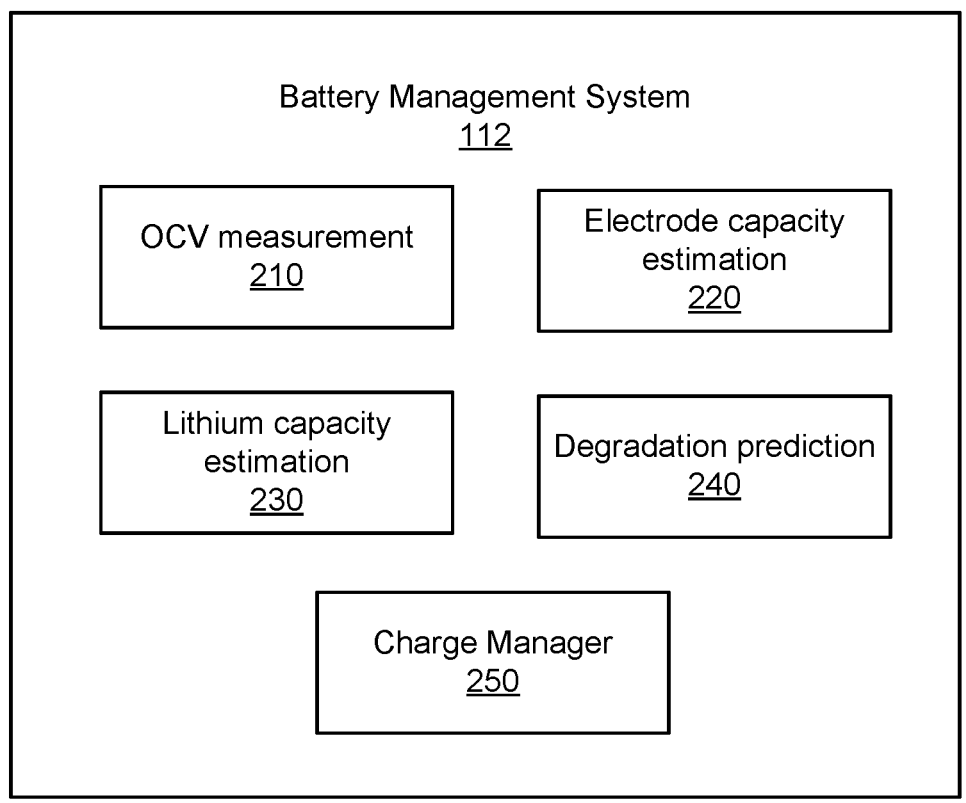
FIG. 2 is a block diagram of a battery management system.

FIG. 2 is a block diagram of a battery management system. BMS 112 of FIG. 2 provides more detail for BMS 112 of the system of FIG. 1. BMS 112 includes OCV measurement 210, electrode capacity estimation 220, lithium capacity estimation 230, and degradation prediction 240. OCV measurement 210 measures the open circuit voltage of battery 114. The OCV measurement may occur at different state of charge levels. In some instances, the state of charge levels may be spread out over the full range of possible charge values. For example, when four SOC values are measured, they may be measured at 100%, 70%, 50%, and 20%.

Electrode capacity estimation 220 may estimate the capacities of a cathode and electrode of battery 114. Element 220 may use various algorithms, taking advantage of known information for anode and cathode half-cell OCV values at the beginning of battery life, as well as the full cell OCV value at the beginning of battery life. That information, along with the OCV measurements at different SOC values, may be used by element 220 to estimate electrode capacities.

Lithium capacity estimation 230 may estimate the lithium capacity of battery 114. Element 230 may use various algorithms, taking advantage of known information for anode and cathode half-cell OCV values at the beginning of battery life, as well as the full cell OCV value at the beginning of battery life. That information, along with the OCV measurements at different SOC values, may be used by element 220 to estimate the lithium capacity.

Degradation prediction 240 may utilize the capacity estimations to identify causes of degradation occurring in battery 114. For example, based on the estimated capacities, degradation prediction module may determine that lithium plating is occurring in battery 114. In response to this determination, degradation prediction 240 may indicate the presence of lithium plating to charge manager 250. Charge manager 250, which manages the charging of battery 114, may adjust a charging process, such as for example a fast charging process, to reduce the rate of charge in order to reduce the risk of lithium plating occurring as a result of the fast charging process.

The elements of BMS 112 may be implemented as software modules stored in memory and executed by one or more processors, hardware components, or a combination of these. Further, the elements listed and BMS 112 are exemplary, and more or fewer elements may be implemented to perform the functionality described herein.

Figure 3:
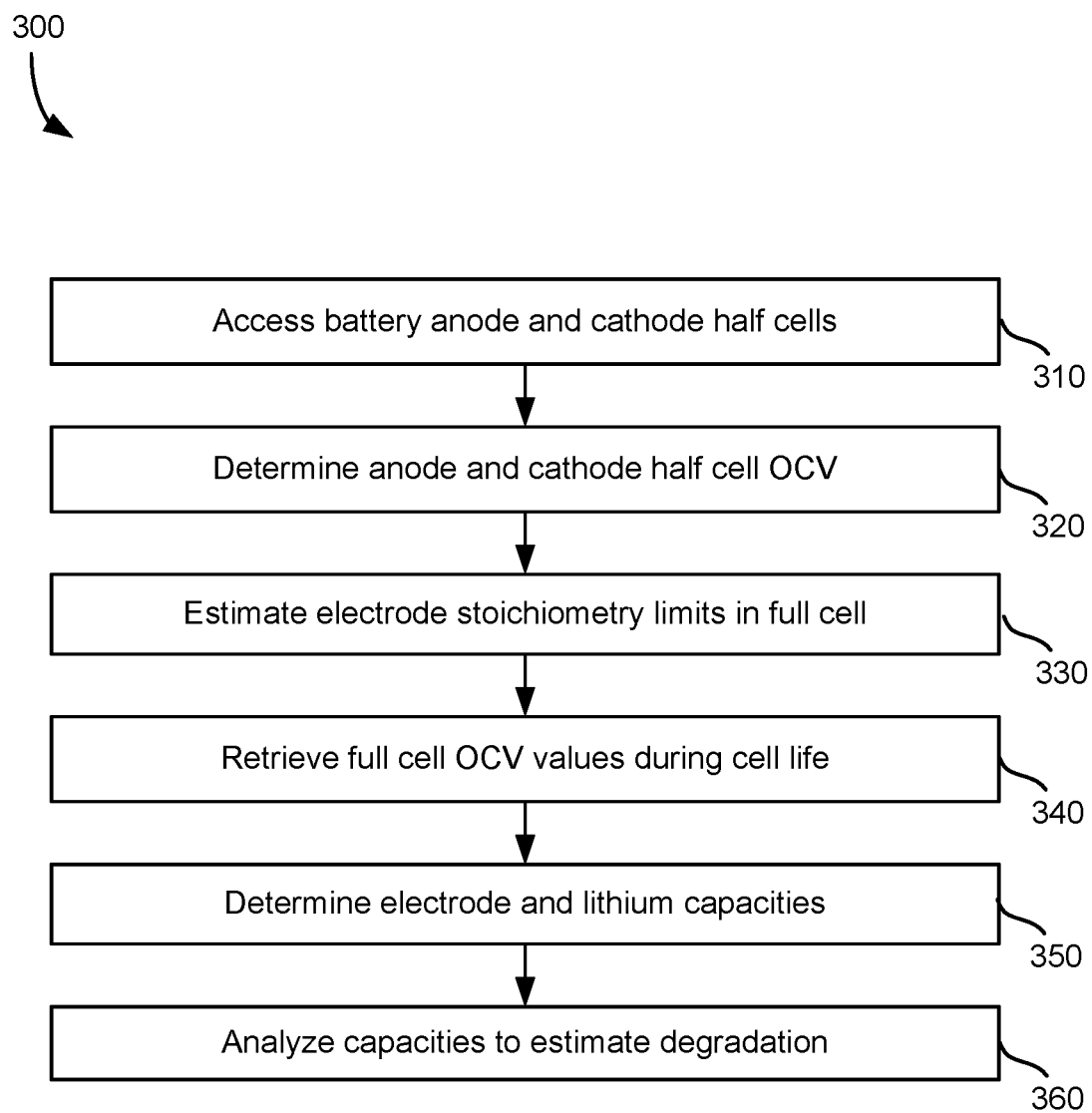
FIG. 3 is a method for monitoring the health of a battery.

FIG. 3 is a method for monitoring the health of a battery. An anode half-cell and cathode half-cell may be accessed at step 310. The half-cells may be accessed by testing machine 140. The half-cells may be accessed by accessing the respective half-cells within a full cell battery, or by otherwise accessing a working anode half-cell or cathode half-cell. The anode half-cell open circuit voltage and cathode half-cell open circuit voltage are determined at step 320. Determining a half-cell open circuit voltage may include measuring OCV at multiple SOCs. More detail for determining the anode and cathode half-cell open circuit voltage is discussed in more detail with respect to the method of FIG. 4. The electrodes stoichiometry limits of a full cell battery are estimated at step 330. A full cell open circuit voltage may be estimated from the half-cell OCV values. In some instances, the full cell OCV can be fit to a graph of half-cell and full cell OCV values based on the half-cell open circuit voltage data points at beginning of life for the battery, for example using a damped least-squares method.

In some instances, the total cyclable Li$^+$ is greater than the usable cyclable Li$^+$ due to cell voltage limits at end of charge and discharge. This extra cyclable Li$^+$ at the beginning of cell life can be calculated as below:

$$\Delta Cap_{Li^+} = Cap_{Li^+}^T - Cap_{Li^+}^U (\text{initial cell cap})$$

where, $Cap_{Li^+}^T$ and $Cap_{Li^+}^U$ are the total and useable cyclable Li$^+$ capacities, respectively. The extra cyclable Li$^+$ capacity can be assumed to be constant during the cell life. However, due to the cell impedance rise, the unusable Li$^+$ may increase as the cell ages. To have a more conservative SOH estimation, it is assumed that the extra cyclable Li$^+$ increases proportionally with the cell resistance growth:

$$\Delta Cap_{Li^+} = \Delta Cap_{Li^+}^0 \times \frac{DCR}{DCR_0}$$

where, $\Delta Cap_{Li^+}^0$ and $DCR_0$ are the extra cyclable Li$^+$ and the cell resistance (e.g. 50% SOC, 25° C., after 10 sec 0.5C pulse) at the beginning of life, respectively. The SOH is then estimated as follows:

$$SOH(\%) = \frac{\min(Cap_A^T, Cap_C^T, Cap_{Li^+}^T - \Delta Cap_{Li^+})}{\text{initial Cell } Cap} \times 100$$

where, $Cap_C^T$ and $Cap_A^T$ are total cathode capacity and total anode capacity, respectively.

Full cell OCV values are retrieved during the life of the battery cell at step 340. In some instances, the OCV values of the full cell may be retrieved at any time during cell life. The OCV values can be retrieved by BMS 112 at different SOC levels, for example at four or more SOC values spread out through the range of charge. When four OCV values are obtained at different SOC values, the SOC values can be 100%, 70%, 50%, and 20%, or other SOC values that are dispersed throughout the full range of charge for the battery. The number of SOC values at which the OCV is obtained may vary, for example between four to eight SOC values.

Electrode and lithium capacities are determined at step 350. The electrode and lithium capacities may be determined based at least in part on the anode and cathode half-cell OCV at cell beginning of life, full cell OCV at beginning of life, and the OCV values captured during cell life at step 340. More detail for determining electrode and lithium capacities is discussed with respect to the method of FIG. 5.

Once the capacities are determined, the capacities may be analyzed to estimate degradation at step 360. Analyzing capacities may include comparing a plurality of samples for the capacities, such as the capacities for anode, cathode, and lithium at beginning of life and any determined capacity during cell life. In some instances, a trend may be analyzed for any of the anode, cathode, or lithium capacities, using the beginning of life capacity and multiple cell life capacities.

After comparing the capacities, the trends in degradation of the anode, cathode, and lithium may be identified. For example, if the lithium capacity is detected to decrease much more rapidly than the anode capacity and cathode capacity, a determination can be made that the more rapidly decreasing lithium capacity is due to lithium metal plating. In response to detecting lithium metal plating, subsequent fast charging techniques can be modified to charge at a lower C-rate for battery 114, resulting in less lithium plating than what would typically occur when charging the battery 114 at a higher C-rate.

Figure 4:
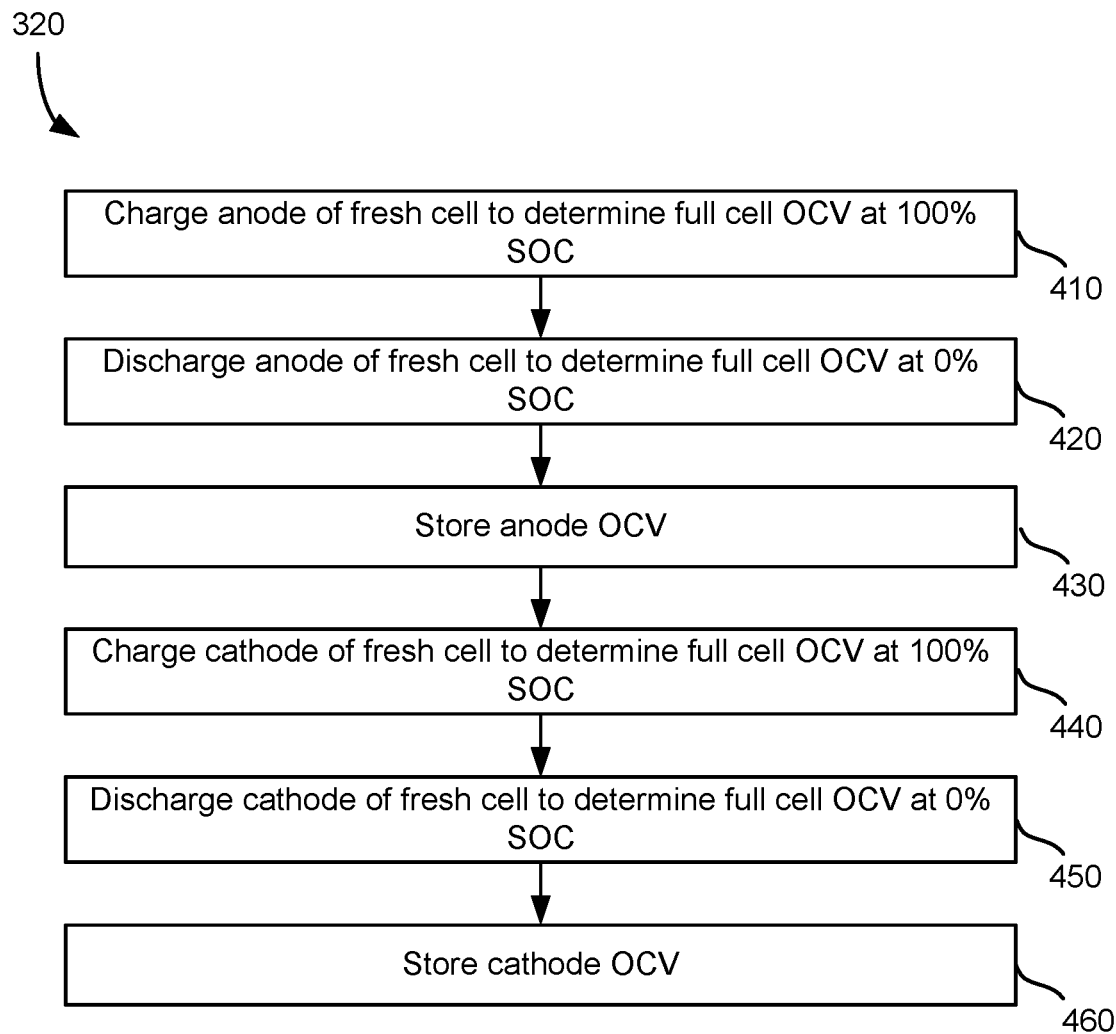
FIG. 4 is a method for determining an anode and cathode OCV.

FIG. 4 is a method for determining an anode and cathode OCV. The method of FIG. 4 provides more detail for step 320 of the method of FIG. 3. First, an anode of a fresh cell is charged to determine a full cell OCV at 100% SOC. The anode is then discharged to determine the full cell OCV at 0% SOC. The discharge may occur at a very slow rate, in order to determine as accurately as possible, the OCV at 0% SOC. For example, the anode discharge may begin at 100% SOC, experience a 5% discharge, the battery anode may then rest for 6 hours, followed by another 5% discharge. This method can require several hours, such as for example 6 hours, to measure OCVs at different SOCs between 100% and 0%. This process can continue until the battery anode being discharged is at 0% SOC, at which point the OCV would be obtained from the battery anode. The anode OCV data is then stored at step 430.

At the beginning of life, the cell OCV, half-cell anode and cathode OCVs are measured at multiple SOCs. By fitting cell OCV using anode and cathode OCVs, the stoichiometry limits in each electrode can be found. Similar to the anode, the discharge may occur at a very slow rate, in order to determine as accurately as possible, the OCV at 0%. Hence, the cathode discharge may begin at 100% SOC, and the cathode OCV can be measured at 95%, 90%, 85%, and so forth through 5% and 0%. This process can continue until the cathode being discharged is at 0% SOC, at which point the OCV would be obtained from the cathode. The cathode OCV data is then stored at step 430.

Figure 5:
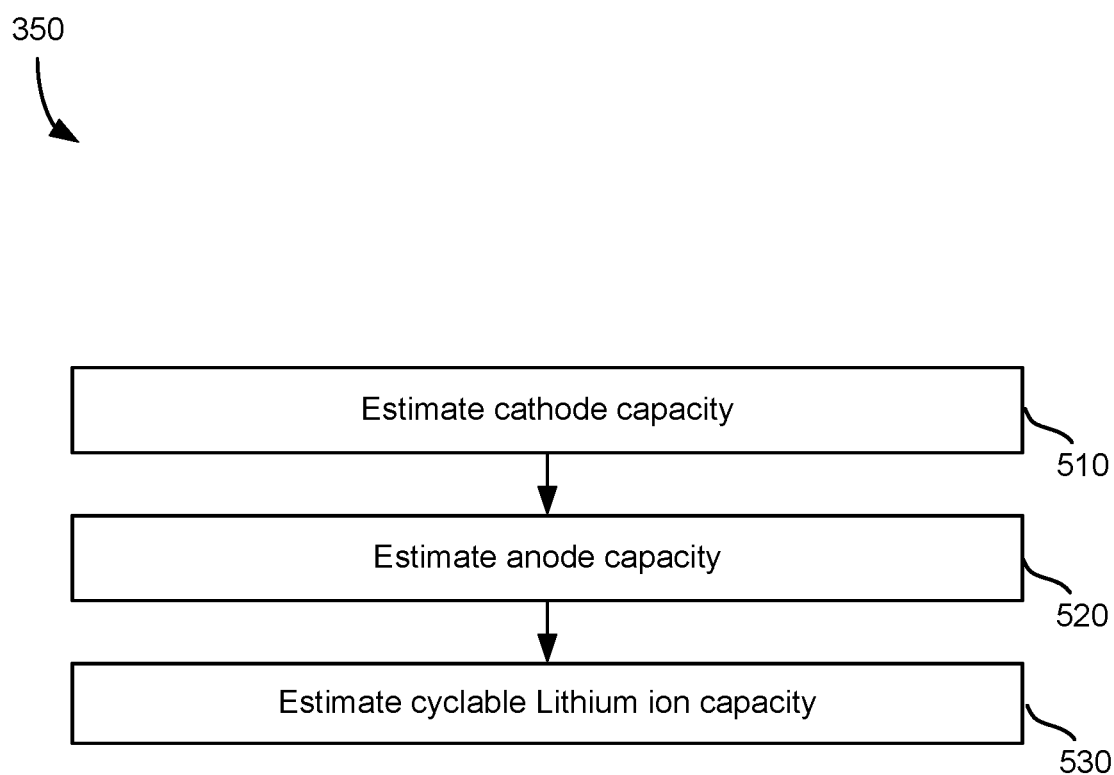
FIG. 5 is a method for determining electrode and lithium capacities.

FIG. 5 is a method for determining electrode and lithium capacities. The method of FIG. 5 provides more detail for step 350 of the method of FIG. 4. A cathode capacity can be estimated at step 510 and the anode capacity can be estimated at step 520. To determine the capacity of a cathode and anode during the battery cell life, the cell OCV data is fitted by using a fitting algorithm, such as for example the Levenberg-Marquardt least squares algorithm, to satisfy the following equations at different SOCs captured during cell life:

$$y = y_{100} + \frac{\Delta Ah \times (y_{max} - y_{min})}{Cap_C^T} \qquad 1.$$

$$x = x_{100} - \frac{\Delta Ah \times (x_{max} - x_{min})}{Cap_A^T} \qquad 2.$$

$$OCV_{cell} = OCV_C(y) - OCV_A(x) \qquad 3.$$

where $OCV_C$, $OCV_A$, $OCV_{cell}$ are cathode, anode and cell OCV, $\Delta Ah$ is calculated by coulomb counting, $y_{100}$ and $x_{100}$ are the cathode and anode stoichiometries in full-cell, respectively, at 100% SOC, and the maximum and minimum stoichiometries in half-cells are denoted by $y_{max}$, $y_{min}$, $x_{max}$, $x_{min}$.

A cyclical lithium-ion capacity may be estimated at step 530. The total cyclable Li is obtained as follows:

$$Cap_{Li^+}^T = \frac{(x_{100} - x_{min})}{x_{max} - x_{min}} \times Cap_A^T + \frac{(y_{100} - y_{min})}{y_{max} - y_{min}} \times Cap_C^T \qquad 4.$$

where $Cap_C^T$ and $Cap_A^T$ are total cathode capacity and total anode capacity, respectively.

Figure 6:
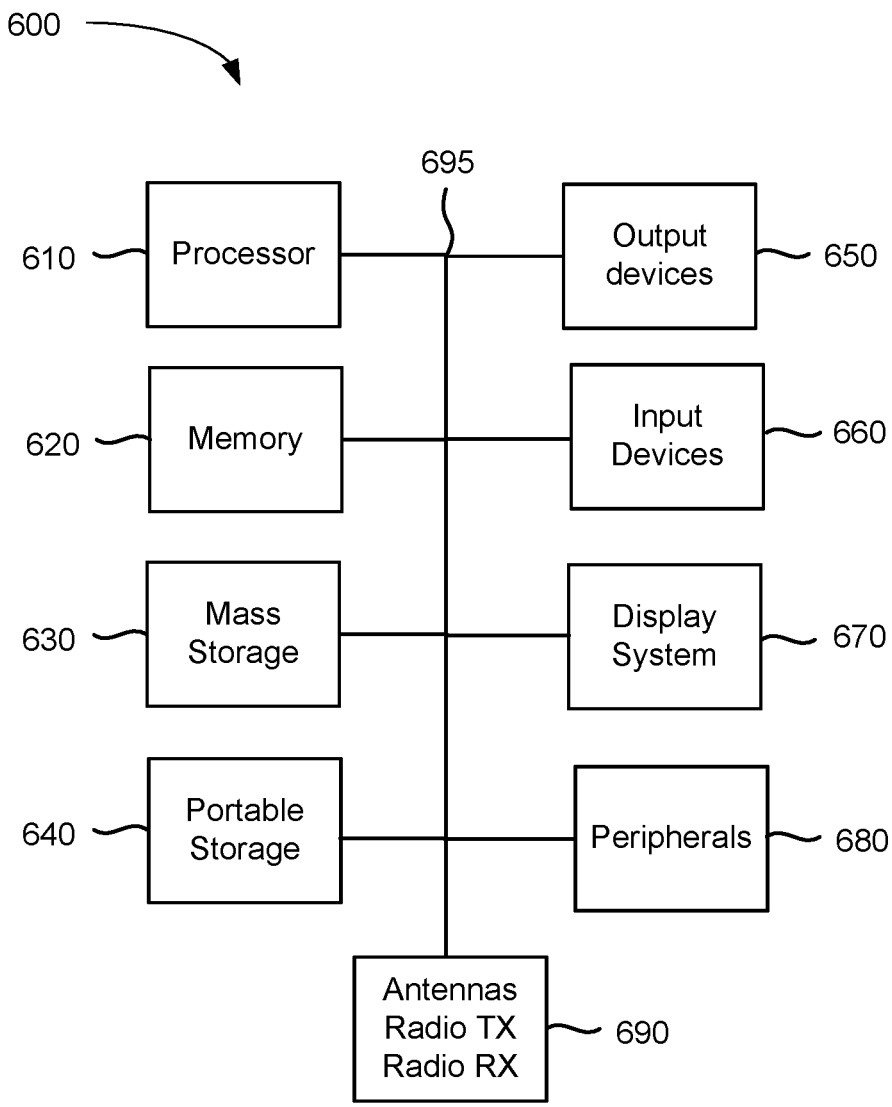
FIG. 6 is a block diagram of a computing environment for implement in the present technology.

FIG. 6 is a block diagram of a computing environment for implementing the present technology. System 600 of FIG. 6 may be implemented in the contexts of the likes of machines that implement battery charging source 120, battery powered system 110, server 130, and testing machine 140. The computing system 600 of FIG. 6 includes one or more processors 610 and memory 620. Main memory 620 stores, in part, instructions and data for execution by processor 610. Main memory 620 can store the executable code when in operation. The system 600 of FIG. 6 further includes a mass storage device 630, portable storage medium drive(s) 640, output devices 650, user input devices 660, a graphics display 670, and peripheral devices 680.

The components shown in FIG. 6 are depicted as being connected via a single bus 690. However, the components may be connected through one or more data transport means. For example, processor unit 610 and main memory 620 may be connected via a local microprocessor bus, and the mass storage device 630, peripheral device(s) 680, portable storage device 640, and display system 670 may be connected via one or more input/output (I/O) buses.

Mass storage device 630, which may be implemented with a magnetic disk drive, an optical disk drive, a flash drive, or other device, is a non-volatile storage device for storing data and instructions for use by processor unit 610. Mass storage device 630 can store the system software for implementing embodiments of the present invention for purposes of loading that software into main memory 620.

Portable storage device 640 operates in conjunction with a portable non-volatile storage medium, such as a floppy disk, compact disk or Digital video disc, USB drive, memory card or stick, or other portable or removable memory, to input and output data and code to and from the computer system 600 of FIG. 6. The system software for implementing embodiments of the present invention may be stored on such a portable medium and input to the computer system 600 via the portable storage device 640.

Input devices 660 provide a portion of a user interface. Input devices 660 may include an alpha-numeric keypad, such as a keyboard, for inputting alpha-numeric and other information, a pointing device such as a mouse, a trackball, stylus, cursor direction keys, microphone, touch-screen, accelerometer, and other input devices. Additionally, the system 600 as shown in FIG. 6 includes output devices 650. Examples of suitable output devices include speakers, printers, network interfaces, and monitors.

Display system 670 may include a liquid crystal display (LCD) or other suitable display device. Display system 670 receives textual and graphical information and processes the information for output to the display device. Display system 670 may also receive input as a touch-screen.

Peripherals 680 may include any type of computer support device to add additional functionality to the computer system. For example, peripheral device(s) 680 may include a modem or a router, printer, and other device.

The system of 600 may also include, in some implementations, antennas, radio transmitters and radio receivers 690. The antennas and radios may be implemented in devices such as smart phones, tablets, and other devices that may communicate wirelessly. The one or more antennas may operate at one or more radio frequencies suitable to send and receive data over cellular networks, Wi-Fi networks, commercial device networks such as a Bluetooth device, and other radio frequency networks. The devices may include one or more radio transmitters and receivers for processing signals sent and received using the antennas.

The components contained in the computer system 600 of FIG. 6 are those typically found in computer systems that may be suitable for use with embodiments of the present invention and are intended to represent a broad category of such computer components that are well known in the art. Thus, the computer system 600 of FIG. 6 can be a personal computer, hand held computing device, smart phone, mobile computing device, workstation, server, minicomputer, mainframe computer, or any other computing device. The computer can also include different bus configurations, networked platforms, multi-processor platforms, etc. Various operating systems can be used including Unix, Linux, Windows, Macintosh OS, Android, as well as languages including Java, .NET, C, C++, Node.JS, and other suitable languages.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

The invention claimed is:

1. A method for determining the health of a battery, comprising:
   determining an open circuit voltage (OCV) for a full battery;
   estimating an electrode stoichiometry by fitting the full battery OCV using a half cell anode OCV and a half cell cathode OCV;
   measuring, by a battery management system on a battery powered system, a plurality of full cell OCVs during the lifecycle of a first battery on the battery powered system, wherein each of the plurality of full cell OCVs are measured at a different state of charge (SOC) for the first battery;
   determining, by the battery management system, an anode capacity, a cathode capacity, and a lithium ion capacity for the first battery based on the measured SOCs, the anode OCV, and the cathode OCV; and
   analyzing, by the battery management system, the anode capacity, a cathode capacity, and the lithium ion capacity to predict a degradation source in the first battery.

2. The method of claim 1, wherein the anode OCV is determined from an anode half-cell and the cathode OCV is determined from a cathode half-cell.

3. The method of claim 2, wherein the anode OCV and the cathode OCV are determined at a beginning of battery life.

4. The method of claim 1, wherein the plurality of full cell OCVs includes four measured full battery OCVs.

5. The method of claim 1, wherein each of the plurality of full battery OCVs is measured using online estimation methods.

6. The method of claim 1, wherein the measured OCV data is used to determine the anode capacity and the cathode capacity at least in part utilizing a damped least squares method.

7. The method of claim 1, wherein determining an anode OCV includes determining the anode OCV at multiple state of charge values between 100% and 0%,
   determining a cathode OCV includes determining the cathode OCV at multiple state of charge values between 100% and 0%,
   wherein the anode capacity, a cathode capacity, and a lithium ion capacity are each determined at least in part based on multiple state of charge values.

8. A non-transitory computer readable storage medium having embodied thereon a program, the program being executable by a processor to perform a method for determining the health of a battery, the method comprising:
   determining an open circuit voltage (OCV) for a full battery;
   estimating an electrode stoichiometry by fitting the full battery OCV using a half cell anode OCV and a half cell cathode OCV;
   measuring, by a battery management system on a battery powered system, a plurality of full cell OCVs during the lifecycle of a first battery, wherein each of the plurality of full cell OCVs are measured at a different state of charge (SOC) for the first battery;
   determining, by the battery management system, an anode capacity, a cathode capacity, and a lithium ion capacity in the first battery based on the measured SOCs, the anode OCV, and the cathode OCV; and
   analyzing, by the battery management system, the anode capacity, a cathode capacity, and a lithium ion capacity to predict a degradation source in the first battery.

9. The non-transitory computer readable storage medium of claim 8, wherein the anode OCV is determined from an anode half-cell and the cathode OCV is determined from a cathode half-cell.

10. The non-transitory computer readable storage medium of claim 9, wherein the anode OCV and the cathode OCV are determined at a beginning of battery life.

11. The non-transitory computer readable storage medium of claim 8, wherein the plurality of full cell OCVs includes four measured full battery OCVs.

12. The non-transitory computer readable storage medium of claim 8, wherein each of the plurality of full battery OCVs is measured using online estimation methods.

13. The non-transitory computer readable storage medium of claim 8, wherein the measured OCV data is used to determine the anode capacity and the cathode capacity at least in part utilizing a damped least squares method.

14. The non-transitory computer readable storage medium of claim 8, wherein determining an anode OCV includes determining the anode OCV at multiple state of charge values between 100% and 0%,
   determining a cathode OCV includes determining the cathode OCV at multiple state of charge values between 100% and 0%,
   wherein the anode capacity, a cathode capacity, and a lithium ion capacity are each determined at least in part based on multiple state of charge values between 100% and 0%.

15. A system for automatically applying a charging profile to a battery cell, comprising:
   one or more processors,
   memory, and one or more modules stored in memory and executable by the one or more processors to determine an open circuit voltage (OCV) for a full battery, estimate an electrode stoichiometry by fitting the full battery OCV using a half cell anode OCV and a half cell cathode OCV, measure a plurality of full cell OCVs during the life-cycle of a first battery, wherein each of the plurality of full cell OCVs are measured at a different state of charge (SOC) for the first battery, determine an anode capacity, a cathode capacity, and a lithium ion capacity in the first battery based on the measured SOCs, the anode OCV, and the cathode OCV, and analyze the anode capacity, a cathode capacity, and a lithium ion capacity to predict a degradation source in the first battery.

16. The system of claim 15, wherein the anode OCV is determined from an anode half-cell and the cathode OCV is determined from a cathode half-cell.

17. The system of claim 16, wherein the anode OCV and the cathode OCV are determined at a beginning of battery life.

18. The system of claim 15, wherein the plurality of full cell OCVs includes four measured full battery OCVs.

19. The system of claim 15, wherein each of the plurality of full battery OCVs is measured using an online estimation method.

20. The system of claim 15, wherein the measured OCV data is used to determine the anode capacity and the cathode capacity at least in part utilizing a damped least squares method.

* * * * *